United States Patent
Mills et al.

(10) Patent No.: US 9,578,771 B2
(45) Date of Patent: Feb. 21, 2017

(54) BACKPLANE MODULE AND METHOD OF MANUFACTURING SAME

(71) Applicant: Labinal, LLC, Denton, TX (US)

(72) Inventors: Patrick Wellington Mills, Bradenton, FL (US); James Michael McCormick, Bradenton, FL (US); David Michael Geier, Punta Gorda, FL (US)

(73) Assignee: LABINAL, LLC, Denton, TX (US)

( * ) Notice: Subject to any disclaimer, the term of this patent is extended or adjusted under 35 U.S.C. 154(b) by 5 days.

(21) Appl. No.: 14/610,048

(22) Filed: Jan. 30, 2015

(65) Prior Publication Data

US 2015/0271942 A1    Sep. 24, 2015

Related U.S. Application Data

(60) Provisional application No. 61/954,845, filed on Mar. 18, 2014.

(51) Int. Cl.
| | | |
|---|---|---|
| *H05K 5/00* | (2006.01) | |
| *G06F 1/16* | (2006.01) | |
| *H05K 7/20* | (2006.01) | |
| *F28F 7/00* | (2006.01) | |
| *H05K 7/02* | (2006.01) | |
| *H02B 1/056* | (2006.01) | |
| *H05K 1/18* | (2006.01) | |
| *H05K 3/12* | (2006.01) | |
| *H05K 3/32* | (2006.01) | |

(52) U.S. Cl.
CPC .............. *H05K 7/02* (2013.01); *H05K 3/1258* (2013.01); *H02B 1/056* (2013.01); *H05K 1/182* (2013.01); *H05K 3/1241* (2013.01); *H05K 3/321* (2013.01); *H05K 2201/10189* (2013.01); *H05K 2201/10303* (2013.01); *H05K 2203/0126* (2013.01)

(58) Field of Classification Search
CPC ...... H05K 7/02; H05K 1/0201; H05K 1/0203; H05K 1/09; H05K 1/0373; H05K 3/321; H05K 7/205; H05K 1/182; H01L 24/48; H01R 4/04
USPC .................. 361/679.01, 679.46, 679.54, 688,361/704–712, 715, 719, 722, 724, 725, 726,361/727; 174/252, 255, 256, 257, 259, 260, 174/266; 165/80.2, 80.3, 104.33, 185
See application file for complete search history.

(56) References Cited

U.S. PATENT DOCUMENTS

| | | | | |
|---|---|---|---|---|
| 4,838,041 A | * | 6/1989 | Bellows | F25B 19/005 165/80.2 |
| 5,462,624 A | * | 10/1995 | Kwon | H01L 23/49531 156/257 |
| 5,493,076 A | * | 2/1996 | Levite | H01L 21/485 174/251 |
| 5,531,020 A | | 7/1996 | Durand | |

(Continued)

FOREIGN PATENT DOCUMENTS

WO    2014011243    1/2014

OTHER PUBLICATIONS

International Search Report filed in PCT/US2015/013728 mailed Apr. 28, 2015.

Primary Examiner — Anthony Haughton
(74) Attorney, Agent, or Firm — Rankin, Hill & Clark LLP

(57) ABSTRACT

A method of manufacturing a backplane module includes providing a thermally conductive substrate, and applying a predetermined volume of epoxy extending between a first electrical component disposed on the thermally conductive (Continued)

substrate and a second electrical component disposed on the thermally conductive substrate to create an electrical pathway therebetween.

18 Claims, 4 Drawing Sheets

(56) References Cited

U.S. PATENT DOCUMENTS

| | | | | |
|---|---|---|---|---|
| 6,134,118 | A * | 10/2000 | Pedersen | H01L 23/3737 174/259 |
| 6,339,256 | B2 * | 1/2002 | Akram | 257/680 |
| 7,460,367 | B2 * | 12/2008 | Tracewell | H05K 7/20672 165/104.21 |
| 7,978,472 | B2 * | 7/2011 | Campbell | H05K 7/20781 165/104.33 |
| 2004/0080332 | A1 * | 4/2004 | Cobbley | G01R 1/0483 324/750.16 |
| 2007/0122549 | A1 * | 5/2007 | Hampden-Smith | B01J 2/003 427/197 |
| 2008/0259566 | A1 * | 10/2008 | Fried | F28D 15/0266 361/699 |
| 2010/0313590 | A1 * | 12/2010 | Campbell | H05K 7/20781 62/259.2 |
| 2010/0314041 | A1 * | 12/2010 | Ng | H05K 3/101 156/278 |
| 2011/0185566 | A1 | 8/2011 | Sugahara | |

* cited by examiner

BACKPLANE MODULE AND METHOD OF MANUFACTURING SAME

BACKGROUND

Field

The disclosed concept pertains generally to backplane modules. The disclosed concept also pertains to methods of manufacturing backplane modules.

Background Information

Known backplane modules typically employ conductive metallic traces embedded within a thermally conductive substrate to electrically connect components of the backplane module. Such conductive traces are manufactured before being placed (i.e., embedded) in the thermally conductive substrate. Additionally, the conductive traces are typically connected to contact points, such as pins, of the backplane module by methods such as brazing, soldering, welding, riveting, or staking. This requires skilled labor and assembly time.

Therefore, there is room for improvement in backplane modules.

There is also room for improvement in methods of manufacturing backplane modules.

SUMMARY

According to one aspect, a method of manufacturing a backplane module includes providing a thermally conductive substrate, and applying a predetermined volume of epoxy extending between a first electrical component disposed on the thermally conductive substrate and a second electrical component disposed on the thermally conductive substrate to create an electrical pathway therebetween.

According to another aspect, a backplane module includes a thermally conductive substrate, a plurality of electrical components disposed on the thermally conductive substrate, and at least one predetermined volume of epoxy extending between at least a first one of the electrical components and at least a corresponding second one of the electrical components, thereby creating an electrical pathway therebetween.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the statement that two or more parts are "connected" or "coupled" together shall mean that the parts are joined together either directly or joined through one or more intermediate parts.

As employed herein, the statement that two or more parts or components "engage" one another shall mean that the parts touch and/or exert a force against one another either directly or through one or more intermediate parts or components.

For purposes of illustration, the disclosed concept is described herein in association with subminiature or aircraft circuit breakers. Such circuit breakers can be employed, for example and without limitation, in aircraft alternating current (AC) systems having a typical frequency of about 400 Hz, but can also be used in direct current (DC) systems. It will be appreciated, however, that the disclosed concept is applicable to a wide range of different electrical systems employing various circuit breakers or other suitable electrical apparatus, for a wide range of different applications.

Figure 1:
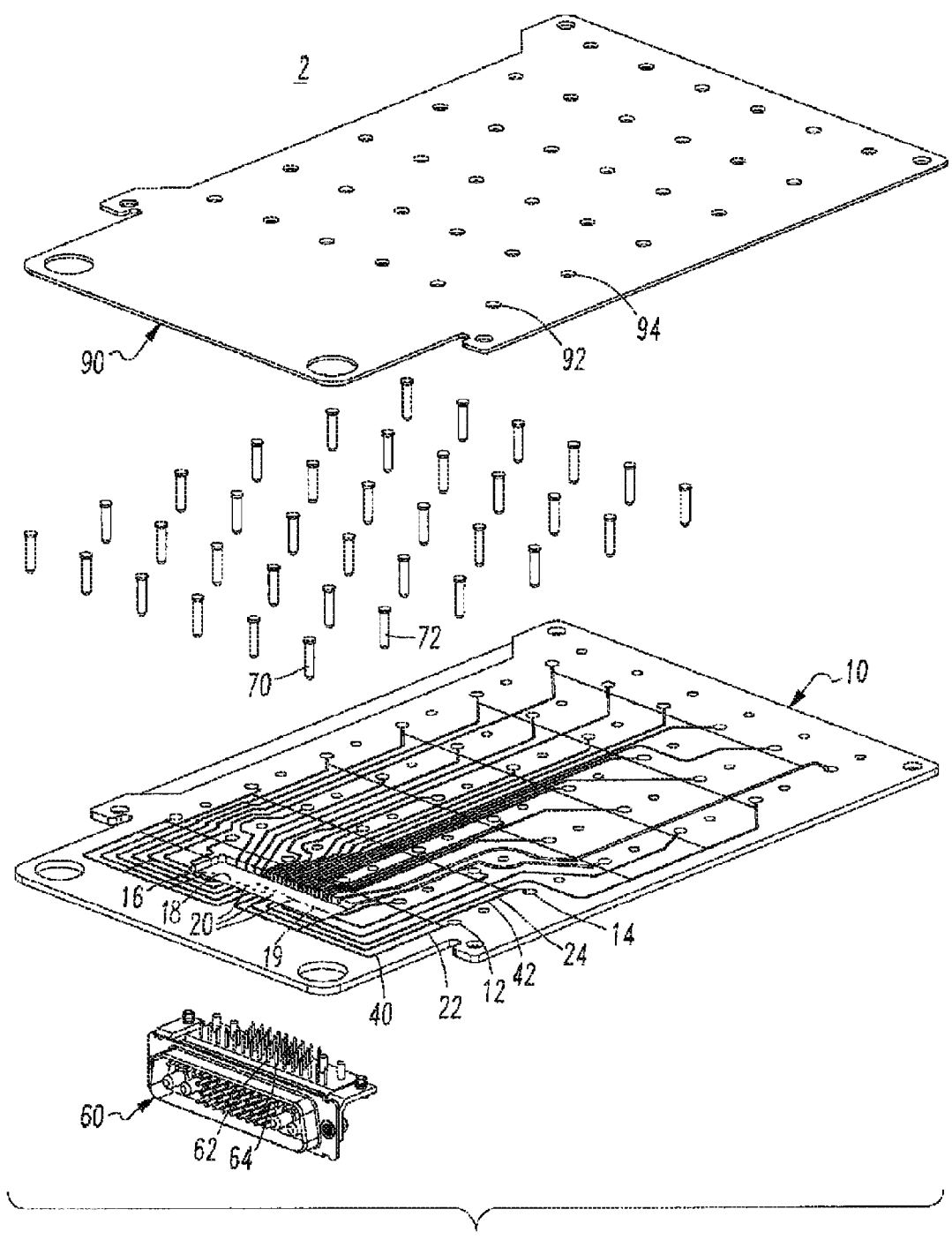
FIG. 1 is an exploded isometric view of a portion of a backplane module for an electrical system, in accordance with an embodiment of the disclosed concept.

FIG. 1 shows a portion of a backplane module 2 in accordance with the disclosed concept. The backplane module 2 includes a thermally conductive substrate 10 (e.g., without limitation, a liquid-crystal polymer (LCP), such as CoolPoly® E-series thermally conductive plastic marketed by Cool Polymers, Inc. of North Kingstown, R.I.; a suitable thermally conductive and electrically insulative epoxy). In the example shown, the backplane module 2 further includes a load connector 60, a number of load pins (two load pins 70,72 are indicated), and a cap layer 90.

The thermally conductive substrate 10 includes a number of through holes (two through holes 12,14 are indicated). Each of the load pins 70,72 extends through a corresponding one of the through holes 12,14.

The thermally conductive substrate 10 further has an elongated aperture 16 and a film (e.g., plastic layer 18) overlying the aperture 16. The plastic layer 18 has an array of grooves (for ease of illustration only one groove 19 is indicated schematically) and a plurality of through holes 20. Although only one groove 19 is indicated, it will be appreciated that each groove of the array of grooves of the plastic layer 18 aligns with a corresponding groove of the thermally conductive substrate (discussed below) and terminates at a corresponding one of the through holes 20. Furthermore, the load connector 60 includes a plurality of pins (two pins 62,64 are indicated). Each of the pins 62,64 extends through a corresponding one of the through holes 20, as shown for example in FIG. 3.

Figure 2:
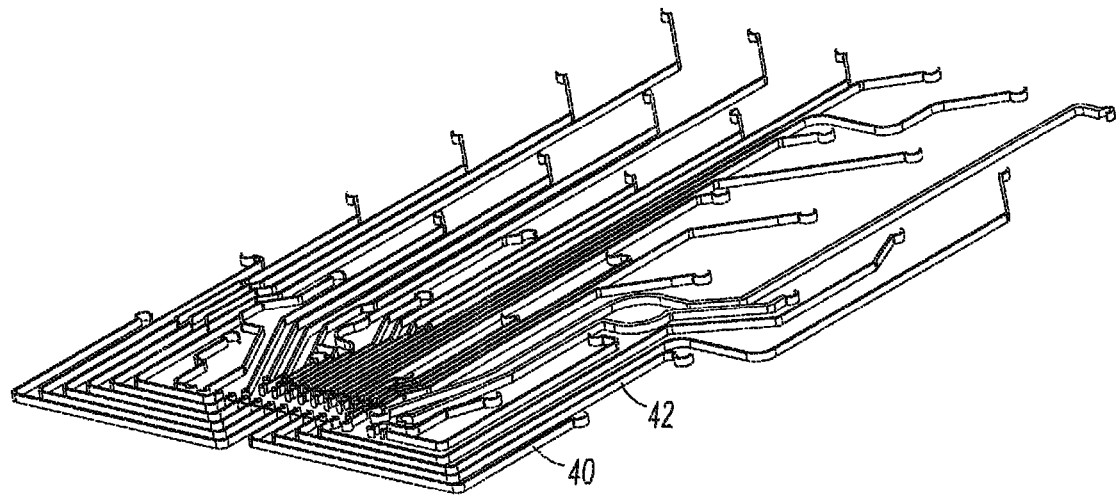
FIG. 2 is a simplified isometric view of an array of predetermined volumes of epoxy for the backplane module of FIG. 1.

Referring to FIGS. 1 and 2, the thermally conductive substrate 10 further includes an array of grooves (two grooves 22,24 are indicated in FIG. 1) and the backplane module 2 (FIG. 1) further includes an array of predetermined volumes of epoxy (two predetermined volumes of epoxy 40,42 are indicated) located in the grooves 22,24. The predetermined volumes of epoxy 40,42 are best shown in FIG. 2. The epoxy is preferably electrically, conductive epoxy, and more preferably is relatively high purity silver conductive epoxy such as, for example and without limitation, Supreme 10HTFS marketed by Master Bond, Inc. of Hackensack, N.J.

Figure 3:
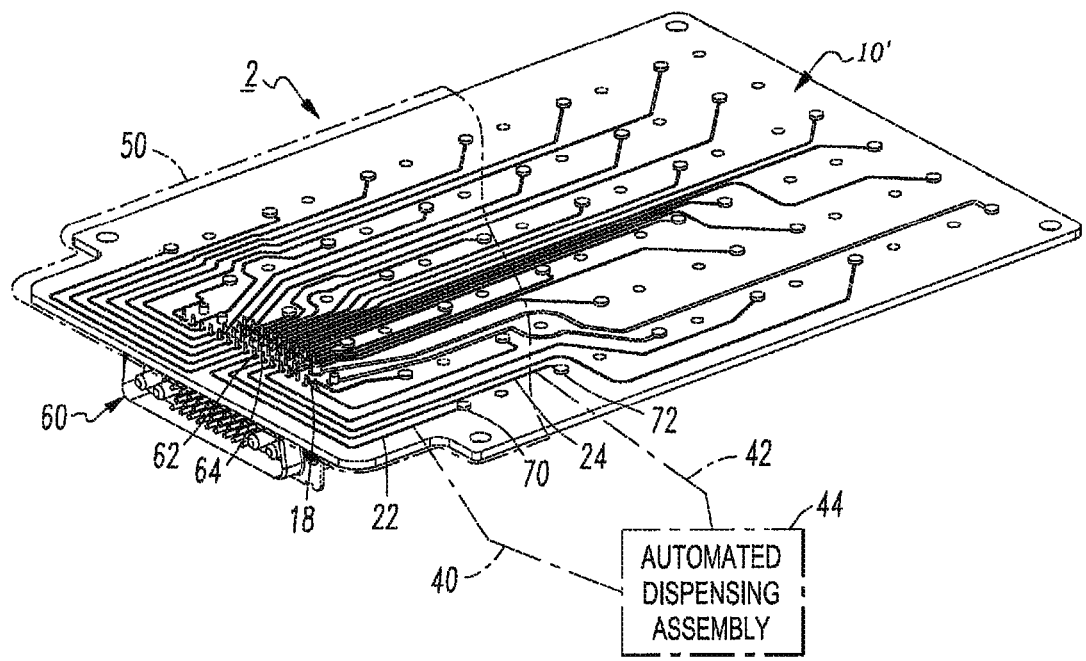
FIG. 3 is an isometric view of the array of epoxy of FIG. 2, shown as employed on the backplane module.

For ease of illustration and in order to adequately view the load connector 60, a slightly modified version of the thermally conductive substrate 10 is shown in FIG. 3 as thermally conductive substrate 10'. As shown, predetermined volume of epoxy 40 extends from the load pin 70, into groove 22, across one of the grooves of the plastic layer 18, and to the pin 62. As a result of being electrically conductive, the predetermined volume of epoxy 40 advantageously functions to create an electrical pathway between the pin 62 of the load connector 60 and the load pin 70. In other words, the pin 62 of the load connector 60 and the load pin 70 are able to be electrically connected without the need for a separate electrical member, thus eliminating the need for manufacturing and assembly of such separate electrical members (e.g., without limitation, wires; embedded electrical conductors; copper traces). The predetermined volume of epoxy 40 also operates to mechanically couple each of the pin 62 and the load pin 70 to the thermally conductive substrate 10'. In this manner, labor and assembly time are significantly reduced, as the need for conventional methods such as, for example and without limitation, brazing, soldering, welding, riveting and staking to couple the load connector 60 and the load pin 70 to the thermally conductive substrate 10' has been eliminated.

Continuing to refer to FIGS. 2 and 3, predetermined volume of epoxy 42 is located in groove 24 and extends between the pin 64, across one of the grooves of the plastic layer 18, and to the load pin 72. Predetermined volume of epoxy 42 thus mechanically couples the pin 64 of the load connector 60 and the load pin 72 to the thermally conductive substrate 10' and also simultaneously creates an electrical pathway extending therebetween. As seen in FIG. 3, the example predetermined volumes of epoxy 40,42, in accordance with one embodiment of the disclosed concept, are preferably applied to the backplane module 2 by controlled dispensing from an automated dispensing assembly 44 (e.g., without limitation, a computer numerical control machine). Among other advantages, this controlled application of epoxy 40,42 reduces assembly time of the backplane module 2, and avoids wasted or excess material being used.

During assembly, once the predetermined volumes of epoxy 40,42 are applied to the thermally conductive substrate 10', an insulator 50 is applied that overlies the thermally conductive substrate 10' (as partially shown in simplified form in phantom line drawing in FIG. 3). The predetermined volumes of epoxy 40,42 are located between the insulator 50 and the thermally conductive substrate 10'.

Next, the cap layer 90 (FIGS. 1, 4A and 4B), which overlies the insulator 50, is provided. The cap layer 90 includes a number of through holes (two through holes 92,94 are indicated). Each of the through holes 92,94 corresponds to one of the load pins 70,72 and one of the through holes 12,14 of the thermally conductive substrate 10. Additionally, the outer perimeter of the cap layer 90 is shaped relatively similar to the outer perimeter of the thermally conductive substrate 10. Once the backplane module 2 is assembled, the predetermined volumes of epoxy 40,42 are cured, preferably at a temperature greater than 250 degrees Fahrenheit, and more preferably at a temperature of about 300 degrees Fahrenheit with preferable cure cycle of about 5-10 minutes. Additionally, although the disclosed concept has been described in association with heating the already-assembled backplane module 2 to cure the predetermined volumes of epoxy 40,42, it is also within the scope of the disclosed concept to cure the predetermined volumes of epoxy 40,42 using any known or suitable alternative method such as, for example and without limitation, using ultraviolet light, before the backplane module 2 is fully assembled. It will also be appreciated that any known or suitable number and/or configuration of grooves and/or volumes of epoxy therefor could be employed other than the example embodiment shown and described herein, which has been provided solely for purposes of illustration and economy of disclosure and is not meant to limit the scope of the disclosed concept to only the particular arrangement shown and described herein.

Figure 4A:
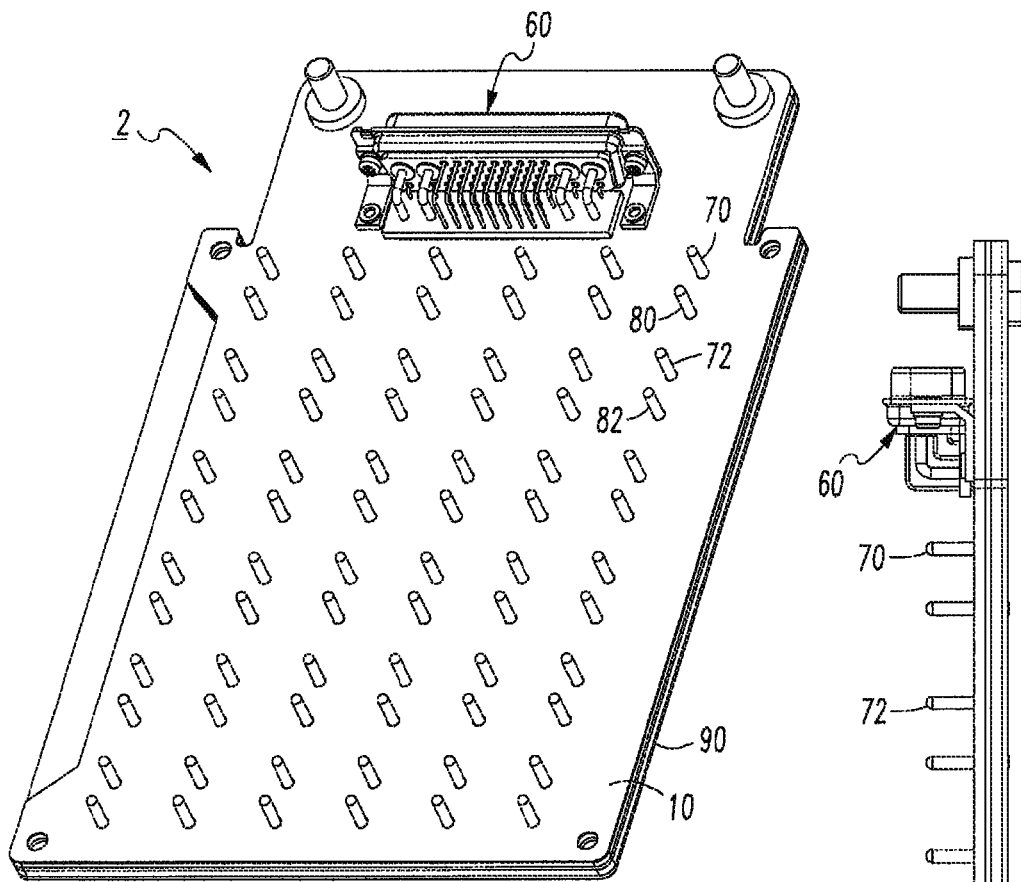
FIGS. 4A and 4B are isometric and side vertical elevation views, respectively, of the backplane module of FIG. 3.
Figure 4B:
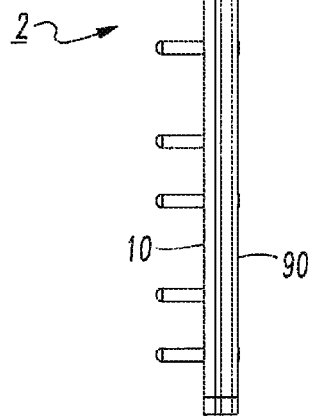

FIGS. 4A and 4B show different views of the assembled backplane module 2. In the example shown, the backplane module 2 also includes a number of line pins (two line pins 80,82 are indicated) corresponding to the load pins 70,72.

Figures 5A, 5B:
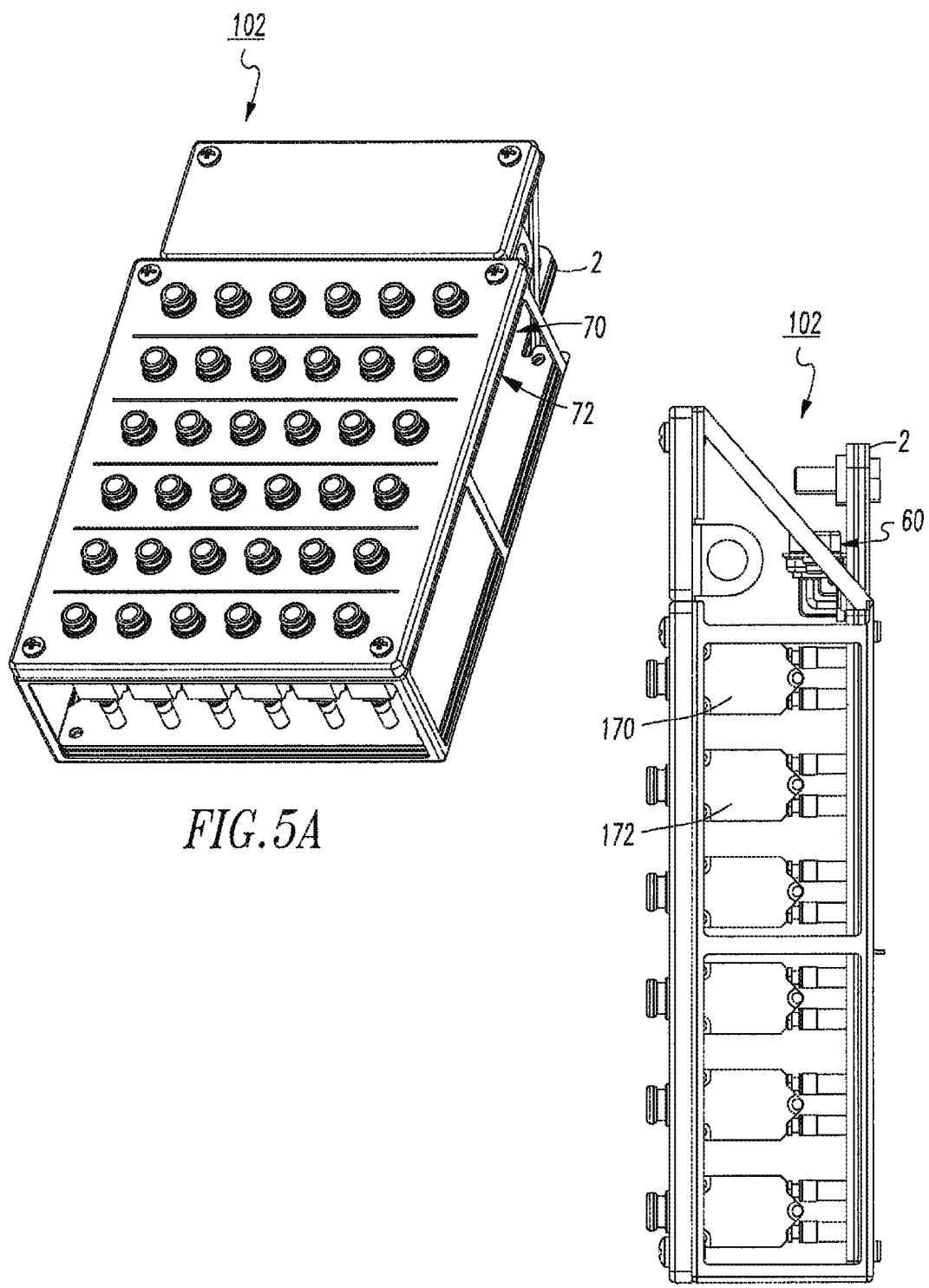
FIGS. 5A and 5B are isometric and side vertical elevation views, respectively, of a circuit breaker panel including the backplane module of FIGS. 4A and 4B, in accordance with an embodiment of the disclosed concept.

FIGS. 5A and 5B show different views of one non-limiting example of an electrical system (e.g., without limitation, circuit breaker panel 102) employing the backplane module 2. As seen, the example circuit breaker panel 102 includes a number of electrical apparatus (two circuit breakers 170,172 are indicated). Circuit breaker 170 engages and is electrically connected to load pin 70 and circuit breaker 172 engages and is electrically connected to load pin 72.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A method of manufacturing a backplane module comprising:
    providing a thermally conductive substrate, and
    applying a predetermined volume of epoxy extending between a first electrical component disposed on said thermally conductive substrate and a second electrical component disposed on said thermally conductive substrate to create an electrical pathway therebetween, wherein said first electrical component is a load connector, and wherein said predetermined volume of epoxy mechanically couples said load connector to said thermally conductive substrate.

2. The method of claim 1 further comprising:
    providing said load connector with a plurality of pins, wherein said predetermined volume of epoxy extends between one of said plurality of pins and said second electrical component to create an electrical pathway therebetween.

3. The method of claim 2 further comprising said predetermined volume of epoxy mechanically coupling said second electrical component to said thermally conductive substrate; and said second electrical component engaging an electrical apparatus.

4. The method of claim 3 further comprising:
    applying an additional predetermined volume of epoxy extending between an additional one of said plurality of pins of the load connector and a third electrical component disposed on said thermally conductive substrate to create an electrical pathway therebetween, wherein said third electrical component engages an additional electrical apparatus, and wherein said additional predetermined volume of epoxy mechanically couples said third electrical component to said thermally conductive substrate.

5. The method of claim 4 wherein at least one of said electrical apparatus and said additional electrical apparatus is a circuit breaker.

6. The method of claim 1 further comprising as said applying step dispensing epoxy from an automated dispensing assembly.

7. The method of claim 1 further comprising:
curing said predetermined volume of epoxy.

8. The method of claim 7 further comprising:
performing said curing step at a temperature greater than 250 degrees Fahrenheit.

9. The method of claim 7 further comprising:
performing said curing step using ultraviolet light.

10. The method of claim 1 further comprising:
providing said thermally conductive substrate with an array of grooves, and
disposing said predetermined volume of epoxy within said array of grooves.

11. The method of claim 1 wherein said epoxy is high purity silver conductive epoxy.

12. The method of claim 1 wherein said load connector includes a plurality of pins, wherein said thermally conductive substrate has an elongated aperture, and wherein said method further comprises:
providing a plastic layer overlying said elongated aperture, said plastic layer having a plurality of through holes, wherein each of the plurality of pins of the load connector is disposed in a corresponding one of the plurality of through holes of the plastic layer, and
wherein said predetermined volume of epoxy extends across said plastic layer and mechanically couples said load connector to said thermally conductive substrate.

13. A backplane module comprising:
a thermally conductive substrate;
a plurality of electrical components disposed on said thermally conductive substrate; and
at least one predetermined volume of epoxy extending between at least a first one of said electrical components and at least a corresponding second one of said electrical components, thereby creating an electrical pathway therebetween, wherein said first one of said electrical components is a load connector, and wherein said predetermined volume of epoxy mechanically couples said load connector to said thermally conductive substrate.

14. The backplane module of claim 13 further comprising a plastic layer having a plurality of through holes; wherein the thermally conductive substrate has an elongated aperture; wherein the plastic layer overlies the elongated aperture; wherein said load connector comprises a plurality of pins each extending through a corresponding one of the through holes of the plastic layer; and wherein said predetermined volume of epoxy extends across the plastic layer to create an electrical pathway between one of said plurality of pins and said corresponding second one of said electrical components.

15. The backplane module of claim 13 wherein said load connector includes a plurality of pins; and wherein said predetermined volume of epoxy mechanically couples at least some of said pins to said thermally conductive substrate.

16. The backplane module of claim 13 wherein said thermally conductive substrate includes an array of grooves; and wherein each of said at least one predetermined volume of epoxy is disposed within a corresponding groove of said array of grooves.

17. The backplane module of claim 13 wherein said epoxy is high purity silver conductive epoxy.

18. A backplane module comprising:
a thermally conductive substrate;
a plurality of electrical components disposed on said thermally conductive substrate; and
at least one predetermined volume of epoxy extending between at least a first one of said electrical components and at least a corresponding second one of said electrical components, thereby creating an electrical pathway therebetween, the backplane module in combination with an electrical system, the electrical system comprising a number of electrical apparatus being electrically connected to a corresponding one of said electrical components of said backplane module, the backplane module further comprising:
an insulator overlying the thermally conductive substrate, said at least one predetermined volume of epoxy being disposed between said insulator and said thermally conductive substrate; and
a cap layer overlying the insulator,
wherein the thermally conductive substrate has a plurality of through holes, each of the plurality of electrical components extending through a corresponding one of the plurality of through holes,
wherein said at least one predetermined volume of epoxy mechanically couples at least one of said plurality of electrical components to said thermally conductive substrate,
wherein said number of electrical apparatus includes at least one circuit breaker, and
wherein said at least one circuit breaker engages said first one of said electrical components.

* * * * *